(12) United States Patent
Hsu

(10) Patent No.: US 6,204,144 B1
(45) Date of Patent: Mar. 20, 2001

(54) METHOD FOR FORMING A METAL CAPACITOR WITH TWO METAL ELECTRODES

(75) Inventor: Hsiu-wen Hsu, Taipei (TW)

(73) Assignee: United Microelectronics Corporation (TW)

( * ) Notice: Subject to any disclaimer, the term of this patent is extended or adjusted under 35 U.S.C. 154(b) by 0 days.

(21) Appl. No.: 09/378,685

(22) Filed: Aug. 20, 1999

(30) Foreign Application Priority Data

Feb. 12, 1999 (TW) .................................. 88102266

(51) Int. Cl.[7] ..................................... H01L 21/20
(52) U.S. Cl. ............................................ 438/396
(58) Field of Search .................... 438/396, 397–399, 438/343–395, 381; 361/313, 322

(56) References Cited

U.S. PATENT DOCUMENTS 5,086,370 * 2/1992 Yasaitis .............................. 361/313
5,479,319 * 12/1995 Smrtic et al. ....................... 361/322

* cited by examiner

*Primary Examiner*—Charles Bowers
*Assistant Examiner*—Craig Thompson
(74) *Attorney, Agent, or Firm*—Fish & Richardson P.C.

(57) ABSTRACT

The present invention provides a method of forming a metal capacitor with two metal electrodes. The first step of the present invention is providing a substrate comprising a source/drain area and a capacitor area. Then a first insulating layer is formed. A step of patterning the first insulating layer is performed to form at least one contact hole. A barrier metal layer is conformably formed on the surface of the contact hole and the insulating layer. Then a metal plug is formed in the contact hole. Then a dielectric plate with an area larger than that of the capacitor area is formed on a predetermined surface of the metal plug and the barriermetal layer. Then a metal layer is formed and patterned to define a top electrode plate, a bottom plate and at least a metal line. The top electrode plate is the metal layer on the top center of the dielectric plate, the bottom electrode plate is the barrier metal layer under the dielectric plate. Such method of forming a metal capacitor not only eliminates the need to form an extra metal layer, but also produces a capacitor meeting the requirement of low voltage coefficient of capacitance.

21 Claims, 4 Drawing Sheets

METHOD FOR FORMING A METAL CAPACITOR WITH TWO METAL ELECTRODES

BACKGROUND OF THE INVENTION

1. Field of the Invention

The present invention provides a method of forming a capacitor, and more particularly, a method of forming a metal capacitor with two metal electrodes.

2. Description of the Prior Art

In the traditional manufacturing of an analog integrated circuit (IC) chip, top and bottom electrodes of a capacitor are usually made of two polysilicon layers. Since the two polysilicon layers will generate a deplete-region in low voltage operation and induce a serial parasitic capacitor to reduce the effective capacitance, such a capacitor with two polysilicon electrodes can't meet the requirement of low voltage coefficient of capacitance.

Recently, capacitors with two metal electrodes in place of two polysilicon electrodes have been disclosed to increase the capacitance of the capacitor. For example, U.S. Pat. No. 5,479,316 provides a method of forming a capacitor with two metal electrodes, wherein each electrode is made respectively of two metal layers. U.S. Pat. No. 5,086,370 also provides a method of forming a capacitor capable of low-voltage operation. A bottom electrode plate of a TiSi/Poly-Si layer and a top electrode plate of Poly-Si/TiSi layer are used in a capacitor to eliminate the deplete-region and meet the requirement of low voltage coefficient of capacitance.

However, while the requirement of low voltage coefficient of capacitance is met by the methods according to the prior art, either the manufacturing process is very complicated, or, at the very least, an extra metal layers is needed to construct the top/bottom electrodes, which results in a higher cost.

SUMMARY OF THE INVENTION

It is therefor a primary object of the present invention to solve the drawbacks in the methods according to the prior art by providing a method of forming a capacitor with two metal electrodes by patterning an existent metal layer for forming the top and bottom electrode plates.

In a first preferred embodiment, the present invention provides a method of forming a metal capacitor with two metal electrodes on a substrate of a semiconductor wafer. The semiconductor wafer comprises a gate area for a gate electrode, a source/drain area for a source/drain electrode, and a capacitor area for the metal capacitor. The method comprises the following steps of: (a) forming a first insulating layer to cover the substrate; (b) patterning the first insulating layer to format least a contact hole to expose the source/drain area; (c) conformably forming a barrier metal layer on the surface of the contact hole and the first insulating layer; (d) forming a metal plug in the contact hole; (e) forming a dielectric layer on the surface of the metal plug and the barrier metal layer; (f) patterning the dielectric layer to expose predetermined areas of the barrier metal layer to form a dielectric plate with a continuous vertical sidewall and an area larger than that of the capacitor area; (g) forming a metal layer on the surface of the dielectric plate, the metal plug and the barrier metal; (h) patterning the metal layer to expose the surface of the continuous vertical sidewall a predetermined area of the surface of the dielectric plate and predetermined areas of the surface of the first insulating layer to separately form a top electrode plate on the surface of the dielectric plate inside the capacitor area, a bottom electrode plate composed of the barrier metal layer under the dielectric plate, and a metal line; and (i) forming a second insulating layer for isolating the top electrode plate, the bottom electrode plate and the metal line.

In a preferred second embodiment, the present invention provides a method for forming a metal capacitor with two metal electrodes on a substrate of a semiconductor wafer. The semiconductor wafer comprises a plurality of conductive-metal lines and a capacitor area for the metal capacitor. The method comprises the following steps of: (a) forming a first insulating layer for covering the substrate; (b) patterning the first insulating layer to form at least a via hole to expose a portion area of the conductive-metal lines; (c) conformably forming a barrier metal layer on the surface of the via hole and the first insulating layer; (d) forming a metal plug in the via hole; (e) forming a dielectric layer on the surface of the metal plug and the barrier metal layer; (f) patterning the dielectric layer to expose predetermined areas of the barrier metal layer to form a dielectric plate with a continuous vertical sidewall and an area larger than that of the capacitor area; (g) forming a metal layer on the surface of the dielectric plate, the metal plug and the barrier metal; (h) patterning the metal layer to expose the surface of the continuous vertical sidewall, a predetermined area of the surface of the dielectric plate and predetermined areas of the surface of the first insulating layer to separately form a top electrode plate on the surface of the dielectric plate inside the capacitor area, a bottom electrode plate composed of the barrier metal layer under the dielectric plate, and a metal line; and (i) forming a second insulating layer for isolating the top electrode plate, the bottom electrode plate and the metal line.

It is an advantage of the present invention that no extra metal layer need to be formed in the present invention in comparison with that in the traditional metal-connection process. Therefor an economic integrated process flow of forming a metal capacitor with two metal electrodes is achieved.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENTS

Embodiments of the present invention will be explained in detail with reference to the accompanying drawings hereinafter.

Figure 1:
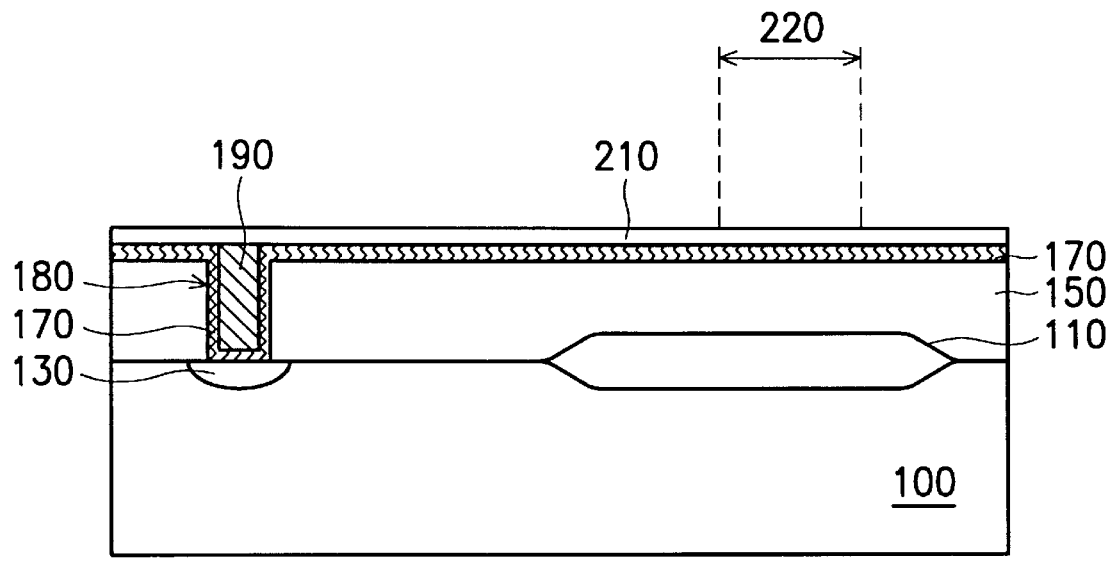
FIG. 1 to FIG. 4 are the cross sectional diagrams illustrating the formation of a capacitor with two metal electrodes in the first metal layer according to the first embodiment of the present invention.

Please refer to FIG. 1 to FIG. 4. As shown in FIG. 1, this first embodiment according to the present invention is employed on a substrate of a semiconductor wafer, such as a silicon substrate. The method of forming such a silicon substrate can be expitaxiail or silicon on wafer. For convenience, the substrate is a positive-type (P-type) silicon substrate hereinafter.

As shown in FIG. 1, the first step of the present invention is providing a P-type substrate 100 with MOS transistors according to well-known technology. A predetermined area on the surface of the P-type substrate 100 is defined as a capacitor area. To prepare the mentioned P-type substrate 100, the present invention employs a thermal oxidation process, such as local oxidation process (LOCOS), to form a field oxide layer 110 to define a plurality of active regions. A MOS transistor composed of a gate electrode (not shown) and a source/drain electrode 130 is formed in an active region by several predetermined processes, such as deposition, lithography and implantation, etc. The gate electrode is usually made of polysilicon, and the source/drain electrode 130 is a negative-type (N-type) doped area inside the P-type substrate 100.

Then an insulator layer 150, such as an oxide layer or a BPSG layer made by chemical vapor deposition (CVD), is formed to cover the substrate 100. For example, an atmospherepressure CVD (APCVD) with a reactant gas such as tetraethyl-ortho-silicate (TEOS) can be employed to form a silicon dioxide layer for covering the substrate 100.

A step of patterning the insulator layer 150 is performed to form at least a contact hole 180 to expose the source/drain area 130. For example, a lithography process is at first performed to form a photo-resist layer for definition of a pattern on the insulator layer 150. Then an anisotropic etch process, such as a reactive ion etch process with CHF3 gas as one of the etchants, is subsequently performed. After the anisotropic etch process, a contact hole 180 is formed to expose a portion of the source/drain area 130. Finally, the photo-resist layer is completely removed.

Then a barrier metal layer 170 is conformably formed on the surface of the contact hole 180 and the first insulating layer 150. A sputtering process, for example, is performed to conformably form a compound layer comprising a titanium layer and a titanium nitride layer or a compound layer comprising a titanium layer and a tungsten-titanium-alloy layer to achieve an electrical connection with the exposed portion of the source/drain area 130.

Then a metal plug 190 is formed in the contact hole 180. The metal plug 190 is formed, for example, by a step of tungsten deposition for forming a tungsten layer to fill the contact hole 180 and cover the surface of the barrier metal layer 170. A subsequent step of an etch-back process for removing the tungsten layer on the surface of the barrier metal layer 170 is performed to form a metal plug in the contact hole 180 and achieve an electrical connection with the barrier metal layer 170.

A dielectric layer 210 is subsequently formed on the surface of the metal plug 190 and the barrier metal layer 170. A deposition process can be employed to form the dielectric layer 210 as a single layer composed of oxide, nitride, silicon oxy-nitride, or tantalum (Ta) oxide, or a compound layer comprising a silicon oxide layer, a silicon nitride layer or a tantalum (Ta) oxide layer. Since the capacitor formed according to the present invention is located in the first metal interconnection layer counted from the surface of the substrate, the dielectric layer 210 can be formed by a low-pressure chemical vapor deposition process and a consolidating process with a temperature of 800 to 900° C. to improve the quality of the dielectric layer 210.

Figure 2:
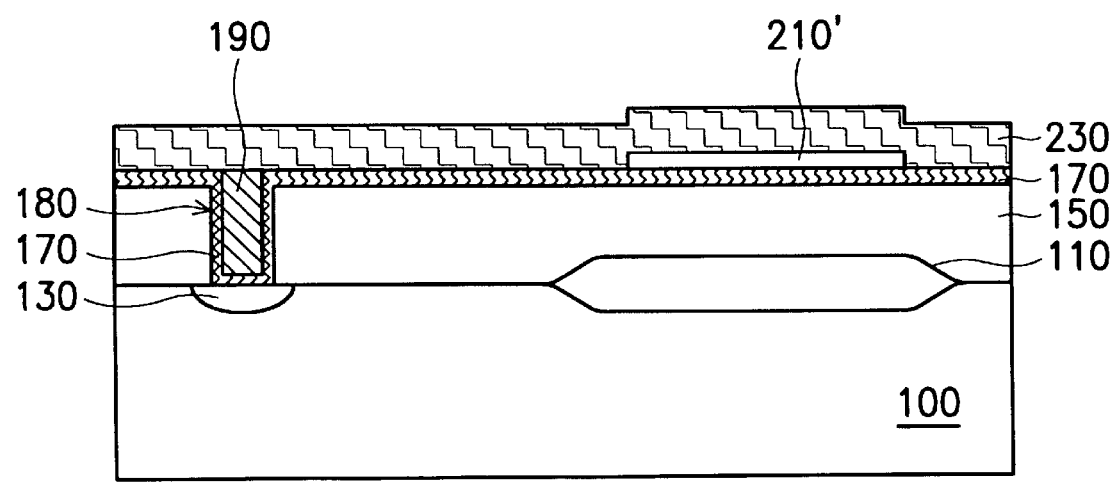

Please refer to FIG. 2. The dielectric layer 210 is patterned to expose predetermined areas of the barrier metal layer 170 to form a dielectric plate 210 with an area larger than that of the capacitor area 220. This step employs a lithography process to define the pattern of the dielectric layer 210. A anisotropic etch process, such as a RIE process, is then employed to expose predetermined areas of the barrier metal layer 170 and form a dielectric plate 210' with a continuous vertical side wall and an area larger than that of the capacitor area 220.

A metal layer 230 is then formed on the surface of the dielectric plate 210', the metal plug 190 and the barrier metal 170. A sputtering process can be employed to form the metal layer 230 composed of alumni or alumni-alloy to cover the surface of the dielectric plate 210', the metal plug 190 and the barrier metal 170.

Figure 3:
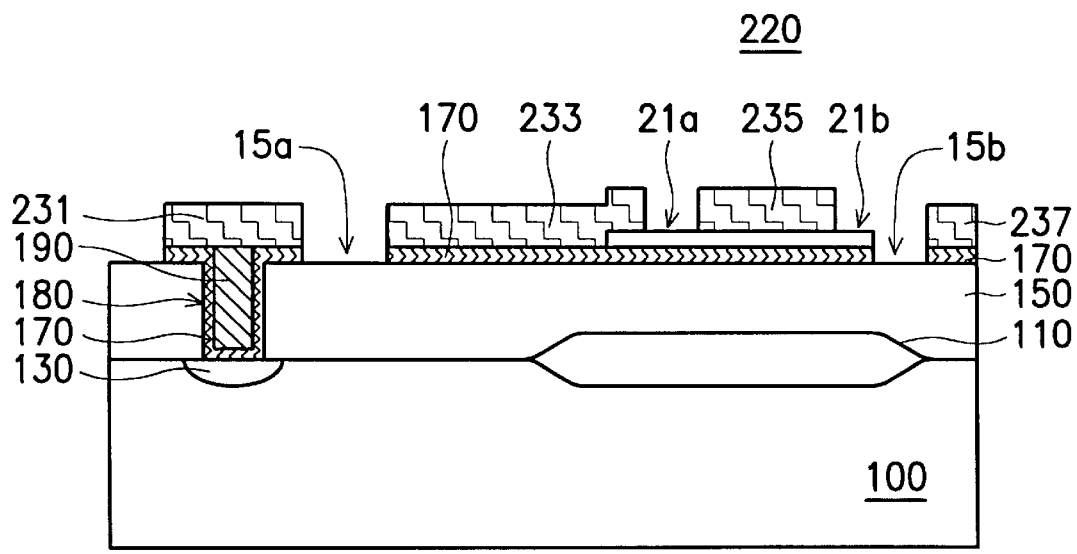
Figure 4:
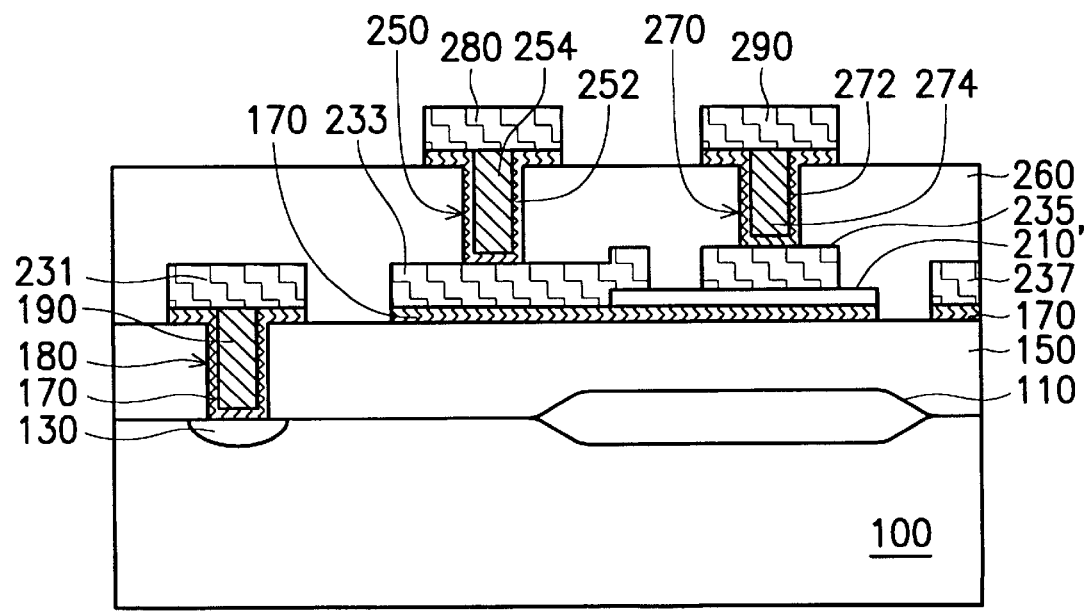

As shown in FIG. 3, a step of patterning the metal layer 230 is performed to expose a predetermined area 21a, 21b of the surface of the dielectric plate 210 and predetermined areas 15a, 15b of the surface of the first insulating layer 150. The remaining of the metal layer 230 separately forms a top electrode plate 235 on the surface of the dielectric plate 210 inside the capacitor area 220, a bottom electrode plate 233 composed of the barrier metal layer 170 under the dielectric plate 210, and metal lines 231, 237. As shown in FIG. 3, the predetermined areas 15a, 15b isolate the metal lines 231, 237. In the beginning, a lithography process is performed to define the pattern of the metal layer 230. Then an anisotropic etch process, such as a RIE process, is performed to etch the metal layer 230 while the dielectric plate 210 and the first insulating layer 150 are used as two etch-stop layers. Thus the predetermined area 21a, 21b of the surface of the dielectric plate 210 and predetermined areas 15a, 15b of the surface of the first insulating layer 150 are exposed to isolate the top electrode plate 235, the bottom electrode plate 233 and the metal lines 231, 237. The top electrode plate 235 is the metal layer 230 on the top center of the dielectric plate 210. The bottom electrode plate 233 is the barrier metal 170 under the dielectric plate 210. The metal lines 231, 237 is the metal layer 230 and the barrier metal layer 170 attached on the surface of the first insulating layer 150. Thus the top electrode plate 235, the bottom electrode plate 233 and the metal lines 231, 237 are simultaneously defined in this step.

After patterning the metal layer 230, a second insulating layer 260, such as a oxide layer or a silicon nitride layer, is formed by a CVD process for isolating the top electrode plate 235, the bottom electrode plate 233 and the metal lines 231, 237.

To finalize the electrical connection of the formed capacitor, a lithography and a etch process can be employed to define the second insulating layer 260 and form via holes 250, 270 to expose portions of the surfaces of the top electrode plate 235 and the bottom electrode plate 233. As in the steps mentioned before, another metal barrier layer 252, 272, such as TiN, TiW, Ti/TiN or Ti/TiW, is conformably formed on the surfaces of the via holes 250, 270 and the second insulating layer 260 by a sputtering process. Then a plurality of metal plugs 254, 274 of tungsten is formed inside the via holes 250, 270 to achieve electrical connections with the top electrode plate 235 and the bottom electrode plate 233. Then metal plugs are formed in the via holes 250, 270 to achieve the objective of interconnection with the top/bottom electrode plate 235, 233. Then a plurality of metal lines 280, 290 are formed in a second metal interconnection layer counted from the surface of the substrate 100. For example, a sputtering process is performed to form a second metal interconnection layer composed of alumni or alumni-alloy and achieve electrical connections with the metal plugs 254, 274. Finally patterning the second metal interconnection layer is performed to form metal lines 280, 290 for interconnection.

Figure 5:
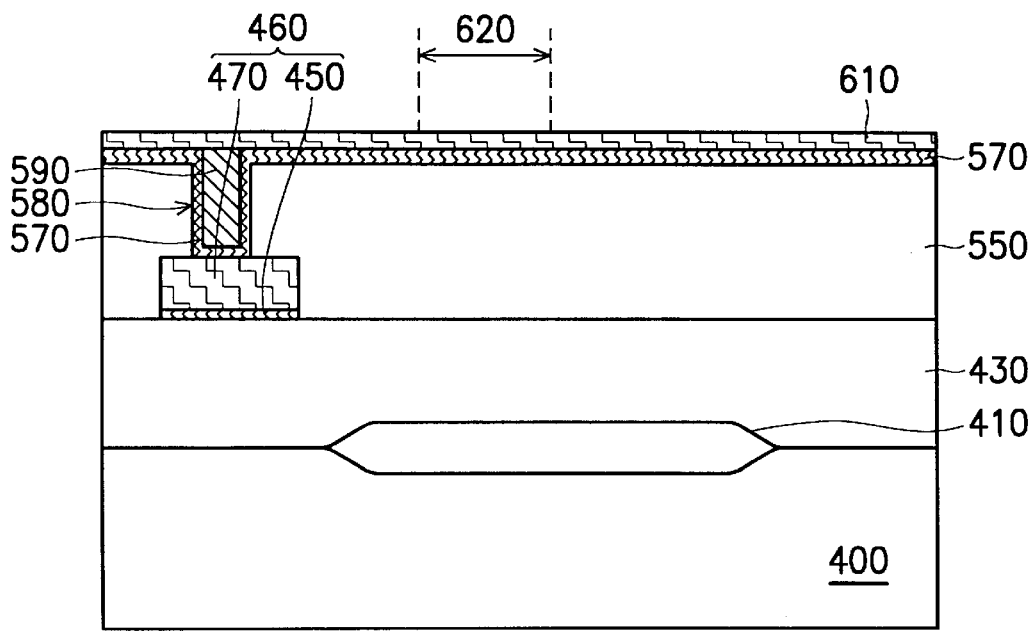
FIG. 5 to FIG. 8 are the cross section diagrams illustrating the formation of a capacitor with two metal electrodes in the second metal layer according to the second embodiment of the present invention.

Please refer to FIG. 5 to FIG. 8. As shown in FIG. 5, this second embodiment according to the present invention is employed on a substrate of a semiconductor wafer, for example, a silicon substrate. The method of forming such a silicon substrate can be expitaxiail or silicon on wafer. For convenience, the substrate is a positive-type (P-type) silicon substrate hereinafter.

As shown in FIG. 5, the first step of the present invention is providing a P-type substrate 400 with MOS transistors according to well-known technology. A predetermined area on the surface of the P-type substrate 400 is defined as a capacitor area 620. To prepare the mentioned P-type substrate 400, the present invention can employs a thermal oxidation process, such as local oxidation process (LOCOS), to form a field oxide layer 410 to define a plurality of active regions. A MOS transistor (not shown) is formed in an active region by several predetermined processes, such as deposition, lithography and implantation, etc.

Then an insulator layer 430, such as an oxide layer or a BPSG layer made by chemical vapor deposition (CVD), is formed to cover the substrate 400. For example, a low-pressure CVD (LPCVD) process with a reactant gas such as tetra-ethylortho-silicate (TEOS) can be employed to form a silicon dioxide layer for covering the substrate 400.

A structure with multiple metal-layers for interconnecting is subsequently formed on the substrate 400. Such a structure comprises a plurality of metal lines. According to this second embodiment of the present invention, the interconnection is achieved by a plurality of second conductive-metal lines 460 in a second metal interconnection layer covered by an inter-metal-dielectric (IMD) layer (a first insulator layer 550), of oxide for isolation. The second conductive-metal lines 460 may comprise a barrier metal layer 450 and a main metal layer 470 on the surface of the barrier metal layer 450. The barrier metal layer 450 may be a metal layer of TiN, TiW, Ti/TiN or Ti/TiW on the surface of the insulator layer 430. The main metal layer 470 may be a metal layer composed of alumni or alumni-alloy on the surface of the barrier metal layer 450.

A step of patterning the insulator layer 550 is performed to form at least a via hole 580 to expose a portion area of the second conductive-metal lines 460. For example, a lithography process is at first performed to form a photo-resist layer for definition of a pattern on the insulator layer 550. Then an anisotropic etch process, such as a reactive ion etch process with CHF3 gas as one of the etchants, is subsequently performed. After the anisotropic etch process, at least a via hole 580 is formed to expose a portion area of the second conductive-metal lines 460.

Then a barrier metal layer 570 is conformably formed on the surface of the via hole 580 and the first insulating layer 550. A sputtering process, for example, is performed to conformably form a compound layer 570 of a titanium layer and a titanium nitride layer or a titanium layer and a tungsten-titanium-alloy layer to achieve an electrical connection with the exposed portion of the second conductive-metal lines 460.

Then a metal plug 590 is formed in the via hole 580. The metal plug 590 is formed, for example, by a step of tungsten deposition for forming a tungsten layer to fill the via hole 580 and cover the surface of the barrier metal layer 570 at first. A step of an etch-back process for removing the tungsten layer on the surface of the barrier metal layer 570 is subsequently performed to form a metal plug in the via hole 580 and achieve an electrical connection with the barrier metal layer 570.

A dielectric layer 610 is subsequently formed on the surface of the metal plug 590 and the barrier metal layer 570. Such a deposition process can be employed to form the dielectric layer 610 as a single layer composed of oxide, nitride, silicon oxy-nitride or tantalum (Ta) oxide, or a compound layer comprising a silicon oxide layer, a silicon nitride layer or a tantalum (Ta) oxide layer.

Figure 6:
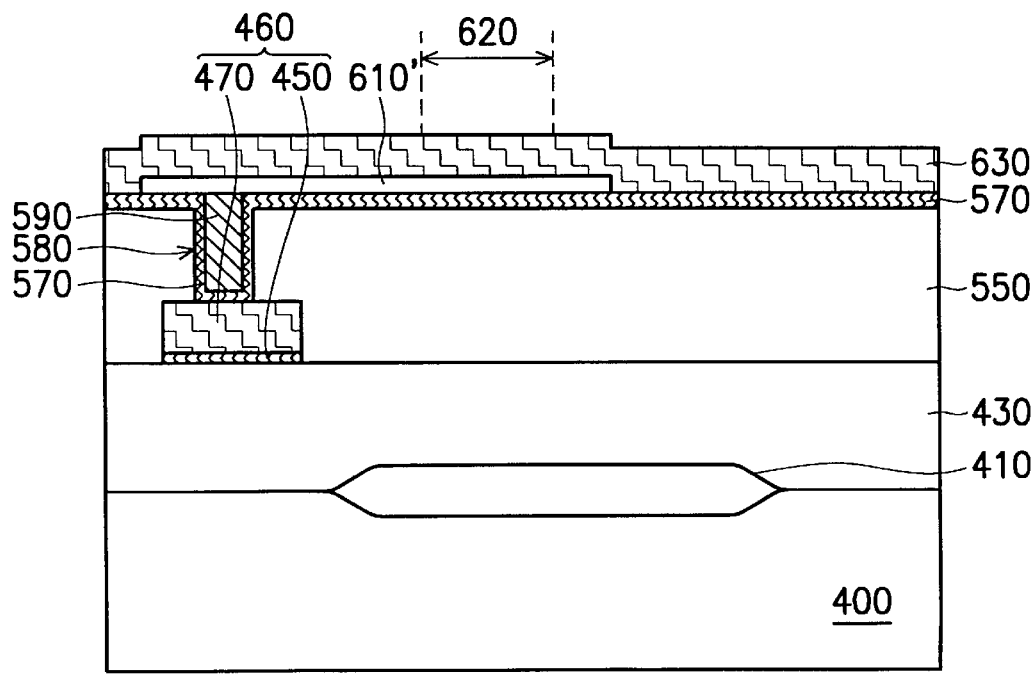

Please refer to FIG. 6. The dielectric layer 610 is patterned to expose predetermined areas of the barrier metal layer 570 to form a dielectric plate 610' covering the metal plug 590 with an area larger than that of the capacitor area 620. This step employs a lithography process to define the pattern of the dielectric layer 610 at first. A anisotropic etch process, such as a RIE process, is then employed to expose predetermined areas of the barrier metal layer 570 and form a dielectric plate 610' covering the metal plug 590 with an area larger than that of the capacitor area 620.

A metal layer 630 is then formed on the surface of the dielectric plate 610', the metal plug 590 and the barrier metal 570. A sputtering process can be employed to form the metal layer 630 composed of alumni or alumni-alloy to cover the surface of the dielectric plate 610', the metal plug 590 and the barrier metal 570.

Figure 7:
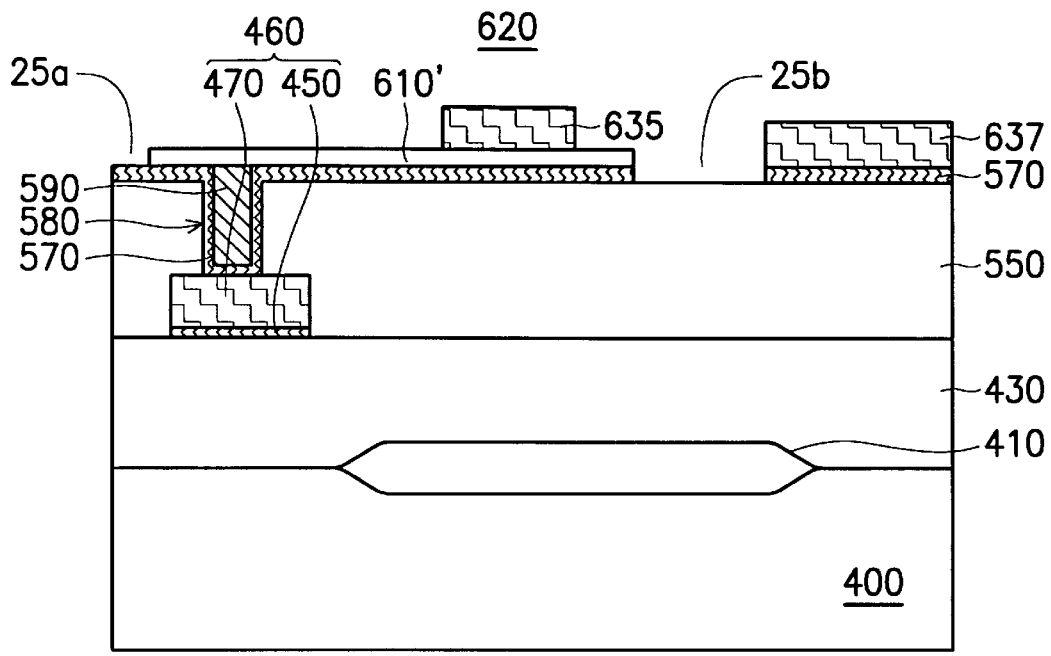

As shown in FIG. 7, a step of patterning the metal layer 630 is performed to expose a predetermined area 61a, 61b of the surface of the dielectric plate 610' and predetermined areas 55a, 55b of the surface of the first insulating layer 550. The remaining of the metal layer 630 separately forms a top electrode plate 635 on the surface of the dielectric plate 610 inside the capacitor area 620, a bottom electrode plate 633 composed of the barrier metal layer 570a under the dielectric plate 610, and metal lines 631, 637. As shown in FIG. 7, the predetermined areas 55a, 55b isolate the metal lines 631, 637. In the beginning, a lithography process is performed to define the pattern of the metal layer 630. Then an anisotropic etch process, such as a RIE process, is performed to etch the metal layer 630 while the dielectric plate 610 and the first insulating layer 550 are used as two etch-stop layers. Thus the predetermined area 61a, 61b of the surface of the dielectric plate 610 and predetermined areas 55a, 55b of the surface of the first insulating layer 550 are exposed to isolate the top electrode plate 635, the bottom electrode plate 633 and the metal lines 631, 637. The top electrode plate 635 is the metal layer 630 on the top center of the dielectric plate 610. The bottom electrode plate 633 is the barrier metal 570a under the dielectric plate 610 and the portion of the metal layer 630 covering across the edge of the dielectric plate 610. The metal lines 631, 637 is the metal layer 630 and the barrier metal layer 570 attached on the surface of the first insulating layer 550. Thus the top electrode plate 635, the bottom electrode plate 633 and the metal lines 631, 637 are simultaneously defined in this step.

Figure 8:
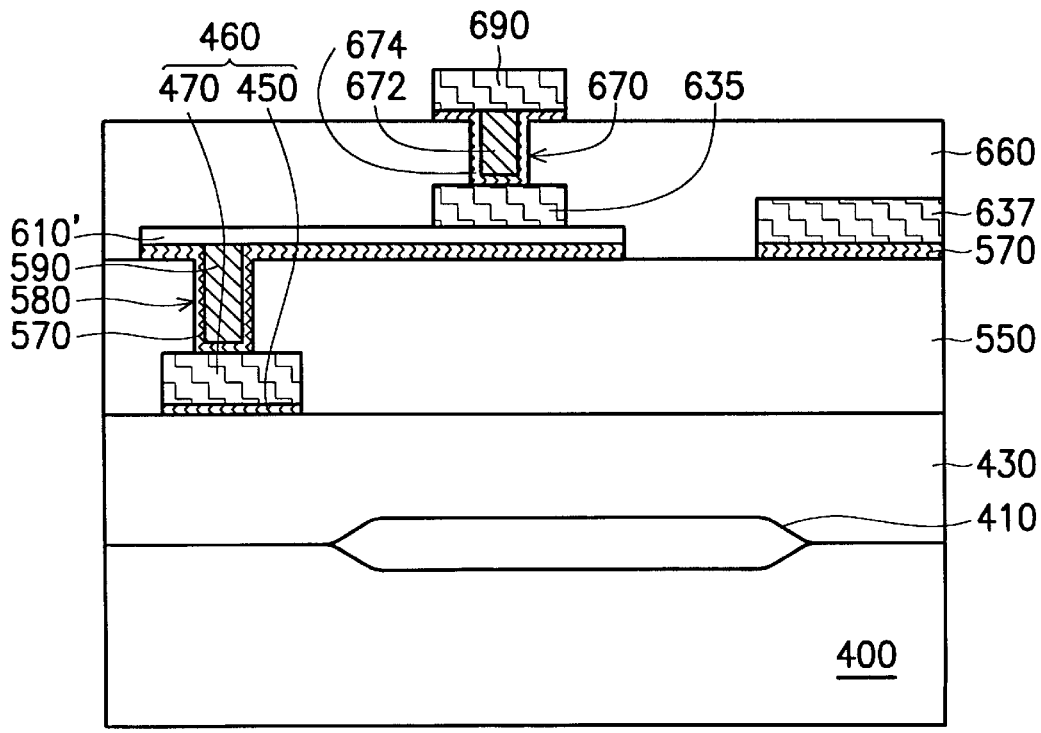

After patterning the metal layer 630, as shown in FIG. 8, a second insulating layer 660, such as a oxide layer or a silicon nitride layer, is formed by a CVD process for isolating the top electrode plate 635, the bottom electrode plate 633 and the metal lines 631, 637.

To finalize the electrical connection of the formed capacitor, a lithography and a etch process can be employed to define the second insulating layer 660 and form via hole 670 to expose portions of the surfaces of the top electrode plate 635. As in the steps mentioned before, another metal barrier layer 674, such as TiN, TiW, Ti/TiN or Ti/TiW, is conformably formed on the surfaces of the via hole 670 and the second insulating layer 660 by a sputtering process. Then a metal plug 672 of tungsten is formed inside the via hole

670 to achieve electrical connections with the top electrode plate 635. Then a metal plug is formed in the via hole 670 to achieve the objective of interconnection with the top electrode plate 635. Then a metal line 690 is formed in another metal interconnection layer. For example, a sputtering process is performed to form a metal interconnection layer composed of alumni or alumni-alloy and achieve electrical connections with the metal plugs 672. Finally, the metal interconnection layer is patterned to form a metal line 690 for interconnection.

Further, the bottom electrode plate 570a under the dielectric plate 610 is electrically connected to the second conductive-metal lines 460 through the metal plug 590 and the barrier metal layer 570.

According to the description above, the method of the present invention forms a top electrode plate and a bottom electrode plate by patterning the metal layer and the barrier metal layer. The metal layer and the barrier metal layer could be the components of a first metal interconnection layer or any metal layer above the first metal interconnection layer, which already exist in IC chips. Thus the formation of the capacitor is simplified and the cost can be saved since there is no extra metal layer needed. Further, the capacitor according to the present invention has less parasitic capacitance with the conductors around it and meets the requirement of low voltage coefficient of capacitance.

The types of material used in the present invention are not constrained by those used in the embodiments and can be replaced with any proper type of material using a proper process. Furthermore, the sizes of the framework in the present invention are not constrained by those used in the embodiments.

Although the present invention has been described in detail, those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a metal capacitor with two metal electrodes on a substrate of a semiconductor wafer, the semiconductor wafer comprising a gate area for a gate electrode, a source/drain area for a source/drain electrode, and a capacitor area for the metal capacitor, the method comprising the following steps:

(a) forming a first insulating layer to cover the substrate;
    (b) patterning the first insulating layer to form at least a contact hole to expose the source/drain area;
    (c) conformably forming a barrier metal layer on the surface of the contact hole and the first insulating layer;
    (d) forming a metal plug in the contact hole;
    (e) forming a dielectric layer on the surface of the metal plug and the barrier metal layer;
    (f) patterning the dielectric layer for exposing predetermined areas of the barrier metal layer to form a dielectric plate with an area larger than that of the capacitor area;
    (g) forming a metal layer on the surface of the dielectric plate, the metal plug and the barrier metal;
    (h) patterning the metal layer to expose a predetermined area of the surface of the dielectric plate and predetermined areas of the surface of the first insulating layer to separately form a top electrode plate on the surface of the dielectric plate inside the capacitor area, a bottom electrode plate composed of the barrier metal layer under the dielectric plate, and a metal line; and
    (i) forming a second insulating layer for isolating the top electrode plate, the bottom electrode plate and the metal line.

2. The method of claim 1, wherein the first insulating layer in step (a) is composed of oxide.

3. The method of claim 1, wherein the first insulating layer in step (a) is composed of BPSG.

4. The method of claim 1, wherein the barrier metal layer in step (c) is composed of a titanium layer and a titanium nitride layer.

5. The method of claim 1, wherein the barrier metal layer in step (c) is composed of a titanium layer and a tungsten-titanium-alloy layer.

6. The method of claim 1, wherein the metal plug in step (d) is composed of tungsten.

7. The method of claim 1, wherein the dielectric layer in step (e) is formed by low-pressure chemical vapor deposition (LPCVD).

8. The method of claim 1, wherein the method further comprises a step of consolidating the dielectric layer by a high temperature process of 800 to 900° C. following step (e).

9. The method of claim 1, wherein the dielectric layer in step (e) is composed of oxide.

10. The method of claim 1, wherein the dielectric layer in step (e) is composed of nitride.

11. The method of claim 1, wherein the dielectric layer in step (e) is composed of silicon oxy-nitride.

12. The method of claim 1, wherein the dielectric layer in step (e) is composed of tantalum (Ta) oxide.

13. The method of claim 1, wherein the dielectric layer is a compound layer comprising a silicon oxide layer, a silicon nitride layer or a tantalum (Ta) oxide layer.

14. The method of claim 1, wherein the metal layer in step (g) is composed of alumni (Al).

15. The method of claim 1, wherein the second insulating layer in step (i) is composed of oxide.

16. A method of forming a metal capacitor with two metal electrodes on a substrate of a semiconductor wafer, the semiconductor wafer comprising a plurality of conductive-metal lines and a capacitor area for the metal capacitor, the method comprising the following steps:

(a) forming a first insulating layer to cover the substrate;
    (b) patterning the first insulating layer to form at least a via hole to expose a portion area of the conductivemetal lines;
    (c) conformably forming a barrier metal layer on the surface of the via hole and the first insulating layer;
    (d) forming a metal plug in the via hole;
    (e) forming a dielectric layer on the surface of the metal plug and the barrier metal layer;
    (f) patterning the dielectric layer to expose predetermined areas of the barrier metal layer to form a dielectric plate with an area larger than that of the capacitor area;
    (g) forming a metal layer on the surface of the dielectric plate, the metal plug and the barrier metal;
    (h) patterning the metal layer to expose a predetermined area of the surface of the dielectric plate and predetermined areas of the surface of the first insulating layer to separately form a top electrode plate on the surface of the dielectric plate inside the capacitor area, a bottom electrode plate composed of the barrier metal layer under the dielectric plate, and a metal line; and (i) forming a second insulating layer for isolating the top electrode plate, the bottom electrode plate and the metal line.

17. The method of claim 16, wherein the barrier metal layer in step (c) is composed of a titanium layer and a titanium nitride layer.

18. The method of claim 16, wherein the barrier metal layer in step (c) is composed of a titanium layer and a tungsten-titanium-alloy nitride layer.

19. The method of claim 16, wherein the barrier metal layer in step (c) is composed of a titanium nitride layer.

20. The method of claim 16, wherein the barrier metal layer in step (c) is composed of a tungsten-titanium-alloy layer.

21. The method of claim 16, wherein the metal layer for forming the conductive-metal lines in (b) is a second metal layer counted from the surface of the substrate or any metal layer above the second metal layer.

\* \* \* \* \*